(12) United States Patent
Bothra et al.

(10) Patent No.: US 6,387,797 B1
(45) Date of Patent: May 14, 2002

(54) METHOD FOR REDUCING THE CAPACITANCE BETWEEN INTERCONNECTS BY FORMING VOIDS IN DIELECTRIC MATERIAL

(75) Inventors: Subhas Bothra; Rao Annapragada, both of San Jose, CA (US)

(73) Assignee: Philips Electronics No. America Corp., New York, NY (US)

( * ) Notice: Subject to any disclaimer, the term of this patent is extended or adjusted under 35 U.S.C. 154(b) by 0 days.

(21) Appl. No.: 09/234,292

(22) Filed: Jan. 20, 1999

(51) Int. Cl.[7] .................... H01L 21/4763; H01L 21/302
(52) U.S. Cl. ................... 438/619; 438/624; 438/633; 438/634; 438/637; 438/645; 438/735; 438/738
(58) Field of Search .............................. 438/622, 624, 438/631, 633, 634, 637, 645, 735, 738, 740, 778, 787, 791, 672, 675, 619, 421, 422

(56) References Cited

U.S. PATENT DOCUMENTS

| | | | | |
|---|---|---|---|---|
| 5,001,079 A | * | 3/1991 | Van Laarhoven et al. | .... 437/50 |
| 5,306,947 A | | 4/1994 | Adachi et al. | ........... 257/642 |
| 5,641,712 A | | 6/1997 | Grivna et al. | ........... 438/624 |
| 5,665,657 A | * | 9/1997 | Lee | ........... 438/624 |
| 5,837,618 A | | 11/1998 | Avanzino et al. | ........... 438/778 |
| 5,969,409 A | * | 10/1999 | Lin | ........... 257/637 |
| 5,981,379 A | * | 11/1999 | Tsai | ........... 438/638 |
| 6,033,981 A | * | 3/2000 | Lee et al. | ........... 438/624 |
| 6,069,069 A | * | 5/2000 | Chooi et al. | ........... 438/634 |
| 6,077,767 A | * | 6/2000 | Hwang | |

FOREIGN PATENT DOCUMENTS

EP        0860 869 A2    8/1998    ......... H01L/23/532

OTHER PUBLICATIONS

PCT International Search Report for counterpart PCT application serial No. PCT/US00/01429 filed Jan. 20, 2000.

* cited by examiner

Primary Examiner—Ha Tran Nguyen
(74) Attorney, Agent, or Firm—Peter Zawilski

(57) ABSTRACT

A method of manufacturing semiconductors is provided which avoids metal deposition in voids formed in the dielectric between interconnects. In a preferred embodiment, an etch stop recess portion is provided over the dielectric which encloses the interconnects to prevent via openings from extending into the voids during the etching of the via openings. Accordingly, metal deposition of the voids during metal deposition of the vias is avoided. As a result, the semiconductors so formed has reduced capacitance between the interconnects and improved reliability since the voids are cleared of any metal deposition.

20 Claims, 4 Drawing Sheets ance between interconnects.
METHOD FOR REDUCING THE CAPACITANCE BETWEEN INTERCONNECTS BY FORMING VOIDS IN DIELECTRIC MATERIAL

TECHNICAL FIELD

The present invention relates generally to manufacturing semiconductors and more specifically to a manufacturing method for forming semiconductors with reduced capacitance between interconnects.

BACKGROUND ART

As technology pushes towards deep sub-micrometer applications, the interconnects which connect integrated circuit devices formed in semiconductor substrates are getting closer together. In order to enhance the speed performance of these deep sub-micrometer devices, it is important to reduce the capacitance between the interconnects to reduce cross talk. Lower dielectric constant materials are required to reduce the capacitance. Air or vacuum has the lowest dielectric constant (approximately equal to 1) as compared to other common available dielectric materials such as silicon dioxide. To enhance the speed performance and reduce cross talk, some technologists have proposed forming voids in the dielectric between interconnects to reduce the dielectric constant.

A significant problem associated with the conventional method of forming voids in the dielectric between interconnects is the potential shorts between interconnects. As interconnects and space dimensions shrink, a small misalignment commonly found in a typical semiconductor process may cause the via openings formed above the interconnects to be extended through the dielectric to the voids. Subsequent filling of the via openings with a conductive material such as tungsten to form vias may cause the conductive material to partially or completely fill the voids. Since the spacings between interconnects are getting very small, any additional conductive material formed in the voids between interconnects could lead to shorts between the interconnects. A method for forming voids in dielectric between interconnects to reduce the capacitance between the interconnects and yet without the potential short circuit problem has long been sought but has eluded those skilled in the art.

DISCLOSURE OF THE INVENTION

The present invention provides a method of manufacturing semiconductors having reduced capacitance between interconnects.

The present invention further provides a method of manufacturing semiconductors that avoids metal deposition in voids formed in dielectric between interconnects.

The present invention still further provides a method of manufacturing semiconductors which avoid metal deposition in voids formed in dielectric between interconnects by providing an etch stop recess portion to prevent via openings from extending to the voids during the etching of the via openings.

The above and additional advantages of the present invention will become apparent to those skilled in the art from a reading of the following detailed description when taken in conjunction with the accompanying drawings.

BEST MODE FOR CARRYING OUT THE INVENTION

Figure 1A:
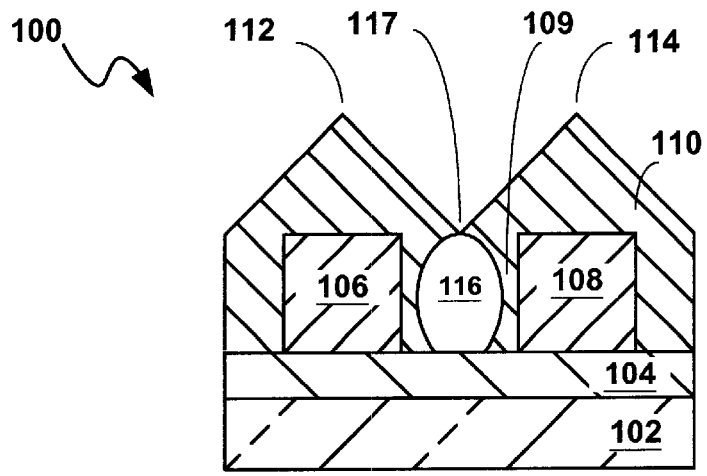
FIGS. 1A (PRIOR ART) through 1D (PRIOR ART) illustrate the sequence of process steps of a conventional process for fabricating a semiconductor device with a void formed in the dielectric between interconnects.

FIGS. 1A (PRIOR ART) through 1D (PRIOR ART) illustrate a conventional process for fabricating a semiconductor device with a void formed in the dielectric between interconnects.

Referring now to FIG. 1A (PRIOR ART), therein is shown a cross-section of a semiconductor 100 in an intermediate stage of processing. At this stage is shown a silicon substrate 102 with a first dielectric layer 104 formed thereon. The first dielectric layer 104 is typically formed of silicon dioxide. Interconnects 106 and 108 are disposed over the first dielectric layer 104 and are separated by a spacing (gap) 109 therebetween. Interconnects 106 and 108 are typically formed of aluminum, tungsten, polysilicon, or copper. A second dielectric layer 110 is formed atop the dielectric layer 104, including over interconnects 106 and 108. The second dielectric layer 110 is typically formed by high density plasma chemical vapor deposition (HDP CVD). The second dielectric layer 110 includes crest portions 112 and 114 disposed over interconnects 106 and 108 respectively, a void 116 that is completely enclosed by the second dielectric layer 110 and located between the interconnects 106 and 108, and a recess portion 117 over the gap 109.

Figure 1B:
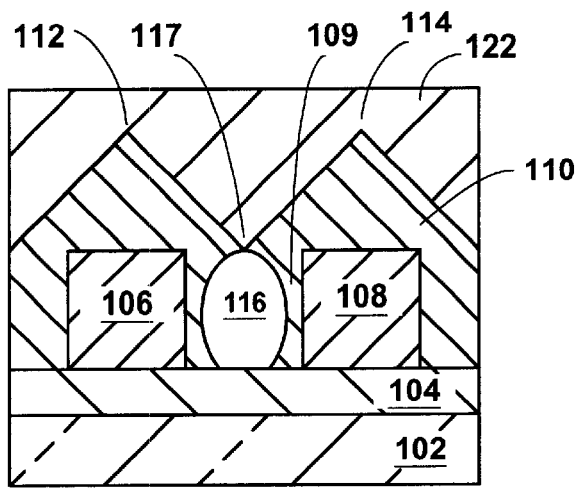

Referring now to FIG. 1B (PRIOR ART), therein is shown the silicon substrate 102 after the deposition of a third dielectric layer 122 using conventional techniques such as plasma enhanced chemical vapor deposition (PE CVD). The third dielectric layer 122 may include phospho silicate glass (PSG) which is used to provide the desired inter-layer dielectric thickness.

Figure 1C:
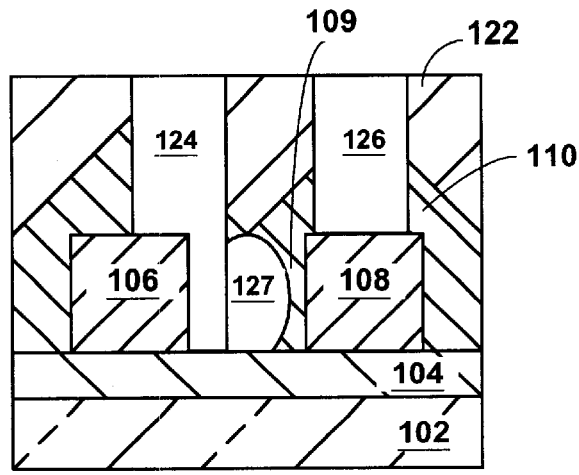

Referring now to FIG. 1C (PRIOR ART), therein is shown the silicon substrate 102 after the formation of via openings 124 and 126 through dielectric layers 122 and 110 using conventional etching technique, such as reactive ion etching. Via openings 124 and 126 expose a portion of interconnects 106 and 108 respectively. It should be noted that via opening 124 is misaligned with respect to the interconnect 106 and extends through the second dielectric layer 110 and into void 116 to form void 127.

Figure 1D:
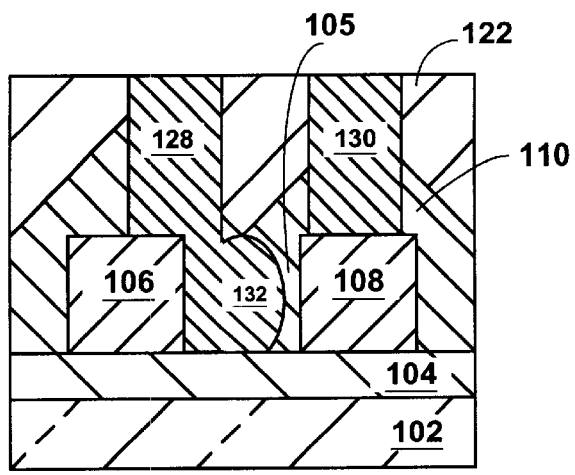

Referring now to FIG. 1D (PRIOR ART), therein is shown the silicon substrate 102 after the conventional steps of metal deposition over the third dielectric layer 122 to fill via openings 124 and 126 to form vias 128 and 130. The metal deposition step is followed by an etch back or a chemical-mechanical polish (CMP). It should be noted that void 127 may be partially or completely filled with metal to form a metalized void 132 which is electrically coupled to via 128 and interconnect 106. The metalized void 132 undesirably reduces the spacing between interconnects 106 and 108, leading to a potential short circuit between interconnects 106 and 108.

The present invention provides a method for forming voids in the dielectric between interconnects to reduce the capacitance between the interconnects without the potential short circuit problem that is encountered in the prior art process.

FIGS. 2A through 2F illustrate the sequence of process steps for fabricating a semiconductor device with a void formed in the dielectric between interconnects in accordance with the present invention.

Figure 2A:
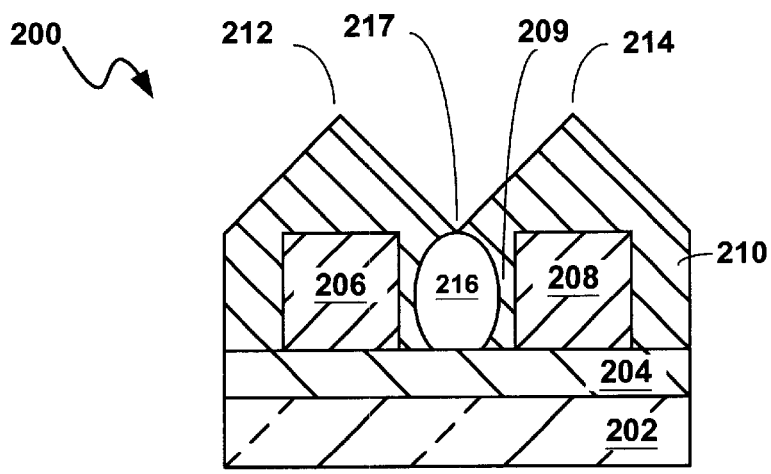
FIGS. 2A through 2F illustrate the sequence of process steps for fabricating a semiconductor device with a void formed in the dielectric between interconnects in accordance with the present invention.

Referring now to FIG. 2A, therein is shown a cross-section of a semiconductor 200 in an intermediate stage of processing. FIG. 2A is similar to what was shown in FIG. 1A (PRIOR ART). At this stage is shown the silicon substrate 202 with a first dielectric layer 204 formed thereon. The first dielectric layer 204 is typically formed of silicon dioxide, though other dielectric materials can be used. Interconnects 206 and 208 are disposed over the first dielectric layer 204 and are separated by a spacing (gap) 209 therebetween. The gap 209 is defined by the walls of interconnects 206 and 208. Interconnects 206 and 208 are typically formed of aluminum, tungsten, polysilicon, or copper, a compound thereof, an alloy thereof, and a combination thereof. A second dielectric layer 210 is formed atop the dielectric layer 204, including over interconnects 206 and 208. The second dielectric layer 210 is typically formed by HDP CVD. Similar to what was shown in FIG. 1A (PRIOR ART), the second dielectric layer 210 includes crest portions 212 and 214 disposed over interconnects 206 and 208 respectively, a void 216 that is completely enclosed by the second dielectric layer 210 and located between the interconnects 206 and 208, and a recess portion 217 over the gap 209.

Figure 2B:
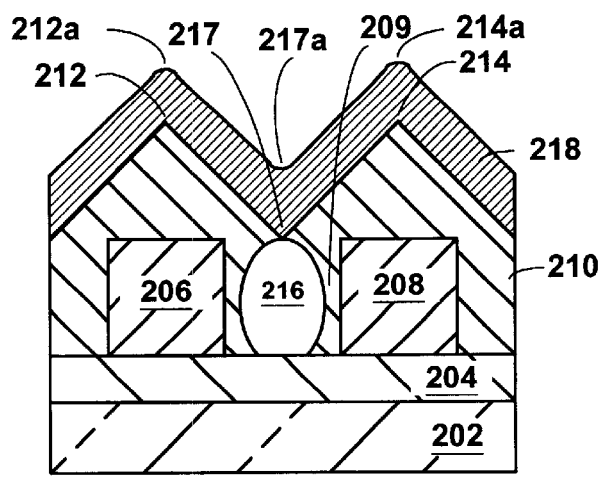

Referring now to FIG. 2B, therein is shown the silicon substrate 202 after the deposition of an etch stop layer 218 using a technique such as plasma enhanced CVD. Etch stop layer 218 replicates the profile of the second dielectric layer 210 to form crest portions 212a, 214a and a recess portion 215a. The etch stop layer 218 includes a material that has a high etch selectivity with respect to the second dielectric layer 210.

Figure 2C:
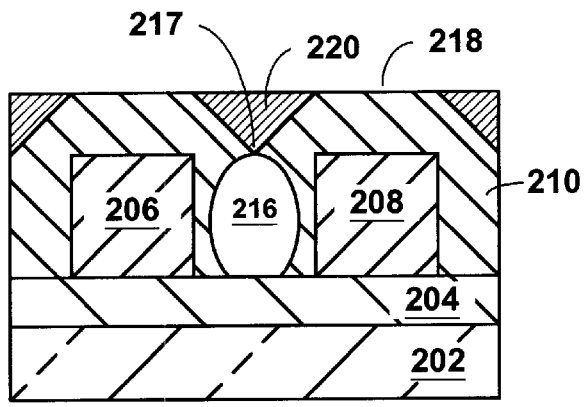

Referring now to FIG. 2C, therein is shown the silicon substrate 202 after the planarization of the etch stop layer 218 and the second dielectric layer 210 to obtain a substantially planar surface 219 and leave the etch stop layer 218 only in the recess portion 217 to form an etch stop recess portion 220.

Figure 2D:
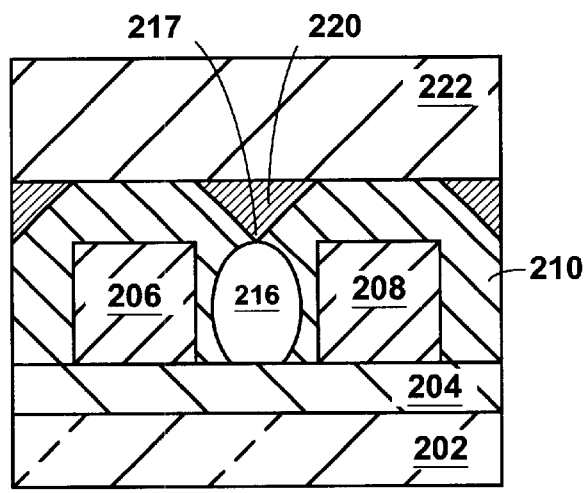

Referring now to FIG. 2D, therein is shown the silicon substrate 202 after the deposition of a third dielectric layer 222 over the planar surface 219 using techniques such as PE CVD. Dielectric layer 222 is used to provide the desired inter-layer dielectric thickness.

Figure 2E:
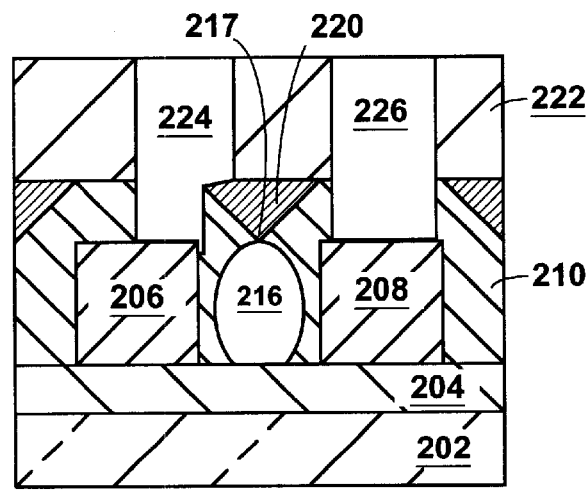

Referring now to FIG. 2E, therein is shown the silicon substrate 202 after the formation of via openings 224 and 226 through dielectric layers 222 and 210 using conventional etching techniques, such as reactive ion etching. Via openings 224 and 226 expose a portion of interconnects 206 and 208, respectively. It should be noted that via opening 224 is misaligned with respect to the interconnect 206. However, unlike the via opening 124 (FIG. 1C (PRIOR ART)), via opening 224 does not extend through second dielectric layer 210 into void 216 due to the presence of the etch stop recess portion 220 over the void 216. The etch stop recess portion 220 minimizes any further etching through the second dielectric layer 210 beyond the top portion of interconnect 206 because of the high etch selectivity of the etch stop recess portion 220 with respect to the second dielectric layer 210. Therefore the via opening 224 is prevented from reaching the void 216.

Figure 2F:
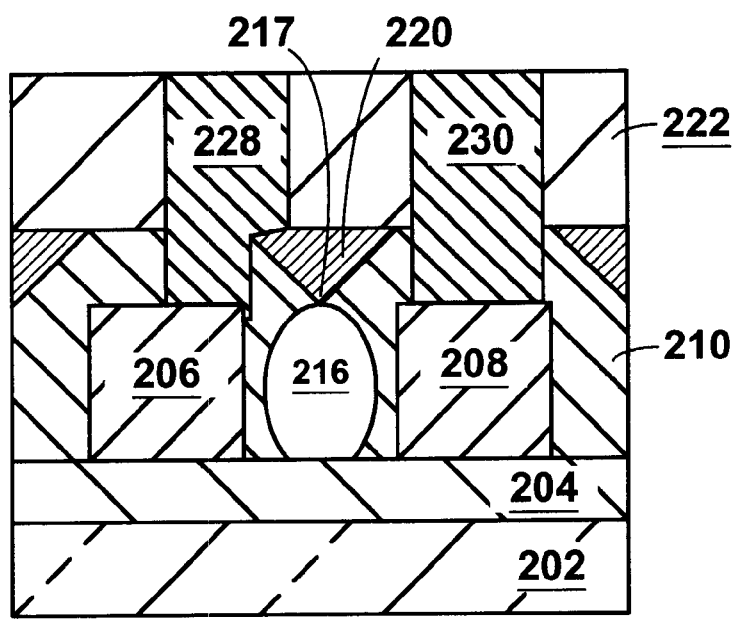

Referring now to FIG. 2F, therein is shown the silicon substrate 202 after the conventional steps of metal deposition over dielectric 222 to fill via openings 224 and 226 to form vias 228 and 230. The metal deposition step is followed by an etch back or CMP. By using the etch stop recess portion 220, the via 228 would not extend beyond the etch stop recess portion 220 into the void 216. Thus, void 216 will be cleared of any metal that is used to fill via openings 224 and 226. Accordingly, the effective spacing between interconnects 106 and 108 remains unchanged, and the potential short circuit problem found in the prior art is eliminated.

Thus, in accordance with this embodiment of the present invention, voids can be formed in the dielectric between interconnects to reduce capacitance without the potential short circuit problem that is found in the prior art.

In the production of the present invention, a conventional process is used to put down a first dielectric layer 204 over a substrate 202 of a semiconductor 200 (FIG. 2A). The first dielectric layer 204 is typically formed of silicon dioxide, though other dielectric materials can be used. Interconnects 206 and 208, and gap 209 are then formed over the first dielectric layer 204 using conventional blanket metal depositions, patterning, and etching techniques. Interconnects 206 and 208 are typically formed of aluminum, tungsten, polysilicon, or copper, a compound thereof, an alloy thereof, and a combination thereof.

Next, a second dielectric layer 210 is formed atop the first dielectric layer 204, including over interconnects 206 and 208. The second dielectric layer 210 includes a material selected from the group consisting of undoped silicate glass (USG), phospho silicate glass (PSG), fluorinated silicate glass (FSG), and borophospho silicate glass (BPSG). In a preferred embodiment, the second dielectric layer 210 is deposited using HDP CVD. The second dielectric layer 210 includes crest portions 212 and 214, a void 216 that is completely enclosed by second dielectric layer 210, and a recess portion 217 over the gap 209.

Thereafter, an etch stop layer 218 is deposited over the second dielectric layer 210 using conventional techniques such as PE CVD (FIG. 2B). The etch stop layer 218 is formed of a material that has a high etch selectivity with respect to the second dielectric layer 210. The etch stop layer 218 includes a material selected from the group consisting of silicon nitride, silicon oxynitride, and silicon carbide. In a preferred embodiment, etch stop layer 218 is a silicon nitride layer with a thickness of a few hundred angstroms. The etch stop layer 218 replicates the profile of the second dielectric layer 210 to form crest portions 212a, 214a and a recess portion 217a.

Next, the etch stop layer 218 and the second dielectric layer 210 are planarized to obtain a substantially planar surface 219 and leave the etch stop layer 218 only in the recess portion 217 to form an etch stop recess portion 220 (FIG. 2C). In a preferred embodiment, the planarization is performed using a chemical-mechanical polishing.

After the planarization of the etch stop layer 218 and the second dielectric layer 210, a third dielectric layer 222 is deposited over the planar surface 219 using conventional techniques such as PE CVD to provide the desired inter-layer dielectric thickness (FIG. 2D). Dielectric layer 222 may include undoped silicate glass (USG), phospho silicate glass (PSG), fluorinated silicate glass (FSG), and borophospho silicate glass (BPSG).

Next, via openings 224 and 226 are formed through dielectric layers 222 and 210 using conventional etching techniques, such as reactive ion etching (FIG. 2E). Via openings 224 and 226 expose a portion of interconnects 206 and 208, respectively. Even though via opening 224 is misaligned with respect to the interconnect 206, the etch stop recess portion 220 minimizes any further etching through the second dielectric layer 210 beyond the top portion of interconnect 206 because of the high etch selectivity of the etch stop recess portion 220 with respect to the second dielectric layer 210. Therefore the via opening 224 is prevented from reaching the void 216.

After the formation of via openings 224 and 226, a metal is deposited over dielectric 222 to fill via openings 224 and 226 to form vias 228 and 230 respectively (FIG. 2F). The metal deposition can be performed using conventional metal deposition techniques such as chemical vapor deposition, physical vapor deposition, electroplating, or a combination thereof. Next, a metal etch back or CMP is used to remove excess metal on the surface of the dielectric layer 222.

Therefore, by forming the etch stop recess portion 220 in accordance with the present invention, a misaligned via opening, such as via opening 224, would not extend beyond the etch stop recess portion 220 into the void 216. Thus, the void 216 will be cleared of any metal that is used to fill vias 224 and 226, and the potential short circuit problem found in the prior art is eliminated.

Thus, in accordance with this embodiment of the present invention, voids can be formed in the dielectric between interconnects to reduce the capacitance between the interconnects without the potential short circuit problem that is found in the prior art.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters set forth herein or shown in the accompanying drawings are to be interpreted in an illustrative and non-limiting sense.

What is claimed is:

1. A method of manufacturing a semiconductor device, comprising the steps of:
    providing a substrate with a first dielectric layer formed thereon;
    depositing a first conductive layer over said first dielectric layer;
    patterning and etching said first conductive layer to form a first interconnect, a second interconnect and a gap between said first interconnect and said second interconnect, wherein said gap is defined by walls of said first interconnect and said second interconnect;
    depositing a second dielectric layer over said first interconnect and said second interconnect by high density plasma deposition, said depositing said second dielectric layer including depositing along said walls, said second dielectric layer formed to a thickness sufficient to fill said gap with a void formed therein, wherein said second dielectric layer includes a first crest portion over said first interconnect, a second crest portion over said second interconnect and a recess portion over said gap;
    depositing an etch stop layer over said second dielectric layer, said depositing said etch stop layer including depositing over said first crest portion, said second crest portion and said recess portion; and
    planarizing said etch stop layer and said second dielectric layer to obtain a substantially planar surface, wherein said planar surface includes a portion of said second dielectric layer over said first interconnect and said second interconnect, and an etch stop recess portion formed of said etch stop layer over said recess portion whereby said void remains in said second dielectric layer.

2. The method as claimed in claim 1 wherein said substrate is a semiconductor substrate.

3. The method as claimed in claim 1 wherein said first conductor layer comprises a material selected from the group consisting of aluminum, tungsten, polysilicon, copper, a compound thereof, an alloy thereof, and a combination thereof.

4. The method as claimed in claim 1 wherein said second dielectric layer comprises a material selected from the group consisting of undoped silicate glass (USG), phospho silicate glass (PSG), fluorinated silicate glass (FSG), and borophospho silicate glass (BPSG).

5. The method as claimed in claim 1 wherein the step of depositing said second dielectric layer over said first interconnect and said second interconnect by high density plasma deposition is performed using high density plasma chemical vapor deposition.

6. The method as claimed in claim 1 wherein said etch stop layer comprises a material selected from the group consisting of silicon nitride, silicon oxynitride, and silicon carbide.

7. The method as claimed in claim 1 wherein the step of planarizing said etch stop layer and said second dielectric layer is performed using chemical-mechanical polishing.

8. The method as claimed in claim 1 including the steps of:
    depositing a third dielectric layer over said planar surface;
    patterning and etching said third and second dielectric layers to form a first opening and a second opening over said first interconnect and second interconnect respectively, said first opening exposes a portion of said first interconnect and said second opening exposes a portion of said second interconnect, wherein said etch stop recess portion has sufficiently high etch selectivity with respect to said second dielectric layer to minimize etching through said etch stop recess portion; and
    depositing a second conductive layer over said third dielectric layer, said second conductive layer formed to a thickness sufficient to fill said first opening and said second opening.

9. The method as claimed in claim 8 wherein said third dielectric layer comprises a material selected from the group consisting of undoped silicate glass (USG), phospho silicate glass (PSG), fluorinated silicate glass (FSG), and borophospho silicate glass (BPSG).

10. The method as claimed in claim 8 wherein said second conductor layer comprises a material selected from the group consisting of aluminum, tungsten, polysilicon, copper, a compound thereof, an alloy thereof, and a combination thereof.

11. A method of manufacturing a semiconductor device, comprising the steps of:
    providing a semiconductor substrate with a first dielectric layer formed thereon;
    depositing a first conductive layer over said first dielectric layer;
    patterning and etching said first conductive layer to form a first interconnect, a second interconnect and a gap between said first interconnect and said second interconnect, wherein said gap is defined by walls of said first interconnect and said second interconnect;
    depositing a second dielectric layer over said first interconnect and said second interconnect by high density plasma deposition, said depositing said second dielectric layer including depositing along said walls, said second dielectric layer formed to a thickness sufficient to fill said gap with a void formed therein, wherein said second dielectric layer includes a first crest portion over said first interconnect, a second crest portion over said second interconnect and a recess portion over said gap;

depositing an etch stop layer over said second dielectric layer, said depositing said etch stop layer including depositing over said first crest portion, said second crest portion and said recess portion;

planarizing said etch stop layer and said second dielectric layer to obtain a substantially planar surface by chemical-mechanical polishing, wherein said planar surface includes a portion of said second dielectric layer over said first interconnect and said second interconnect, and an etch stop recess portion formed of said etch stop layer over said recess portion whereby said void remains in said second dielectric layer;

depositing a third dielectric layer over said planar surface;

patterning and etching said third and second dielectric layers to form a first opening and a second opening over said first interconnect and second interconnect respectively, said first opening exposes a portion of said first interconnect and said second opening exposes a portion of said second interconnect, wherein said etch stop recess portion has sufficiently high etch selectivity with respect to said second dielectric layer to minimize etching through said etch stop recess portion; and depositing a second conductive layer over said third dielectric layer, said second conductive layer formed to a thickness sufficient to fill said first opening and said second opening.

12. The method as claimed in claim 11 wherein said first conductor layer comprises a material selected from the group consisting of aluminum, tungsten, polysilicon, copper, a compound thereof, an alloy thereof, and a combination thereof.

13. The method as claimed in claim 11 wherein said second dielectric layer comprises a material selected from the group consisting of undoped silicate glass (USG), phospho silicate glass (PSG), fluorinated silicate glass (FSG), and borophospho silicate glass (BPSG).

14. The method as claimed in claim 11 wherein the step of depositing said second dielectric layer over said first interconnect and said second interconnect by high density plasma deposition is performed using high density plasma chemical vapor deposition.

15. The method as claimed in claim 11 wherein said etch stop layer comprises a material selected from the group consisting of silicon nitride, silicon oxynitride, and silicon carbide.

16. The method as claimed in claim 11 wherein said third dielectric layer comprises a material selected from the group consisting of undoped silicate glass (USG), phospho silicate glass (PSG), fluorinated silicate glass (FSG), and borophospho silicate glass (BPSG).

17. The method as claimed in claim 11 wherein said second conductor layer comprises a material selected from the group consisting of aluminum, tungsten, polysilicon, cop, a compound thereof, an alloy thereof, and a combination thereof.

18. A method of manufacturing a semiconductor device, comprising the steps of:

providing a semiconductor substrate with a first dielectric layer formed thereon;

depositing a first conductive layer over said first dielectric layer, wherein said first conductor layer comprises a material selected from the group consisting of aluminum, tungsten, polysilicon, copper, a compound thereof, an alloy thereof, and a combination thereof;

patterning and etching said first conductive layer to form a first interconnect, a second interconnect and a gap between said first interconnect and said second interconnect, wherein said gap is defined by walls of said first interconnect and said second interconnect;

depositing a second dielectric layer over said first interconnect and said second interconnect by high density plasma chemical vapor deposition, said depositing said second dielectric layer including depositing along said walls, said second dielectric layer formed to a thickness sufficient to fill said gap with a void formed therein, wherein said second dielectric layer includes a first crest portion over said first interconnect, a second crest portion over said second interconnect and a recess portion over said gap;

depositing an etch stop layer over said second dielectric layer, said depositing said etch stop layer including depositing over said first crest portion, said second crest portion and said recess portion;

planarizing said etch stop layer and said second dielectric layer to obtain a substantially planar surface by chemical-mechanical polishing, wherein said planar surface includes a portion of said second dielectric layer over said first interconnect and said second interconnect, and an etch stop recess portion formed of said etch stop layer over said recess portion;

depositing a third dielectric layer over said planar surface, wherein said third dielectric layer comprise a material selected from the group consisting of undoped silicate glass (USG), phospho silicate glass (PSG), fluorinated silicate glass (FSG), and borophospho silicate glass (BPSG);

patterning and etching said third dielectric layers to form a first opening and a second opening over said first interconnect and second interconnect respectively, said first opening exposes a portion of said first interconnect and said second opening exposes a portion of said second interconnect, wherein said etch stop recess portion has sufficiently high etch selectivity with respect to said second dielectric to minimize etching through said etch stop recess portion; and depositing a second conductive layer over said third dielectric layer, said second conductive layer formed to a thickness sufficient to fill said first opening and said second opening, wherein said second conductor layer comprises a material selected from the group consisting of aluminum, tungsten, polysilicon, copper, a compound thereof, an alloy thereof, and a combination thereof.

19. The method as claimed in claim 18 wherein said second dielectric layer comprises a material selected from the group consisting of undoped silicate glass (USG), phospho silicate glass (PSG), fluorinated silicate glass (FSG), and borophospho silicate glass (BPSG).

20. The method as claimed in claim 18 wherein said etch stop layer comprises a material selected from the group consisting of silicon nitride, silicon oxynitride, and silicon carbide.

* * * * *